US008735876B2

(12) United States Patent
Hwang et al.

(10) Patent No.: US 8,735,876 B2
(45) Date of Patent: May 27, 2014

(54) ORGANIC LIGHT EMITTING DIODE DISPLAY (75) Inventors: Kyu-Hwan Hwang, Yongin (KR);
Seok-Gyu Yoon, Yongin (KR);
Jae-Heung Ha, Yongin (KR);
Young-Woo Song, Yongin (KR);
Jong-Hyuk Lee, Yongin (KR);
Sung-Chul Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/461,693

(22) Filed: May 1, 2012

(65) Prior Publication Data

US 2013/0026456 A1    Jan. 31, 2013

(30) Foreign Application Priority Data

Jul. 29, 2011    (KR) .................. 10-2011-0076031

(51) Int. Cl.
*H01L 51/50*    (2006.01)
(52) U.S. Cl.
USPC .................................. 257/40; 257/E51.019
(58) Field of Classification Search
USPC .................................. 257/E51.001
See application file for complete search history.

(56) References Cited

U.S. PATENT DOCUMENTS

| | | | | |
|---|---|---|---|---|
| 6,992,438 B2 * | 1/2006 | Burroughes et al. | ......... | 313/506 |
| 7,071,612 B2 * | 7/2006 | Burroughes et al. | ......... | 313/503 |
| 7,309,956 B2 * | 12/2007 | Raychaudhuri et al. | ...... | 313/503 |
| 7,449,831 B2 * | 11/2008 | Aziz et al. | ..................... | 313/504 |
| 7,750,561 B2 * | 7/2010 | Aziz et al. | ..................... | 313/506 |
| 7,943,244 B2 * | 5/2011 | Aziz et al. | ..................... | 428/690 |
| 8,093,587 B2 * | 1/2012 | Shiratori et al. | ............... | 257/40 |
| 8,174,001 B2 * | 5/2012 | Kitamura et al. | ............... | 257/40 |
| 8,212,269 B2 * | 7/2012 | Karg et al. | ..................... | 257/98 |
| 2007/0046189 A1 * | 3/2007 | Hatwar et al. | ................ | 313/506 |
| 2009/0001885 A1 * | 1/2009 | Spindler et al. | ............... | 313/506 |
| 2009/0201230 A1 * | 8/2009 | Smith | ............................. | 345/76 |
| 2010/0301741 A1 * | 12/2010 | Kim et al. | ..................... | 313/504 |

(Continued)

FOREIGN PATENT DOCUMENTS

| | | |
|---|---|---|
| KR | 10-0473283 | 10/2003 |
| KR | 10-0527191 | 12/2004 |

(Continued)

OTHER PUBLICATIONS

S.L. Lai, M.Y. Chan, M.K. Fung, C.S. Lee, L.S. Hung, S.T. Lee, Applications of Ytterbium in organic light-emitting devices as high performance and transparent electrodes, Chemical Physics Letters 366 (2002) 128-133.*

(Continued)

*Primary Examiner* — Matthew W Such
*Assistant Examiner* — Stephen C Smith
(74) *Attorney, Agent, or Firm* — Christie, Parker & Hale, LLP (57) ABSTRACT

An organic light emitting diode display, which includes: a first electrode; a second electrode facing the first electrode; and an emission layer interposed between the first electrode and the second electrode. Herein the first electrode includes: a first layer including a material having a work function of about 4.0 eV or less and an electron injection material; and a second layer including a material having a resistivity of about 10 μΩcm or less. The first layer is disposed between the second layer and the emission layer.

19 Claims, 5 Drawing Sheets

(56) References Cited

U.S. PATENT DOCUMENTS

| | | | |
|---|---|---|---|
| 2011/0133633 A1* | 6/2011 | Yoon et al. | 313/504 |
| 2011/0204342 A1* | 8/2011 | Jeong et al. | 257/40 |
| 2012/0007055 A1* | 1/2012 | Kim et al. | 257/40 |
| 2012/0019124 A1* | 1/2012 | Hente | 313/498 |
| 2012/0112628 A1* | 5/2012 | Yoon et al. | 313/504 |
| 2012/0267614 A1* | 10/2012 | Tajima et al. | 257/40 |
| 2012/0286318 A1* | 11/2012 | Lee et al. | 257/99 |

FOREIGN PATENT DOCUMENTS

| | | |
|---|---|---|
| KR | 10-0721428 | 4/2007 |
| KR | 10-2007-0078599 A | 8/2007 |
| WO | WO 2006-132226 A1 | 12/2006 |

OTHER PUBLICATIONS

W.F. Xie, K.C. Lau, C.S. Lee, S.T. Lee, Transparent organic light-emitting devices with LiF/Yb:Ag cathode, Thin Solid Films 515 (2007) 6975-6977.*

K.C. Lau, W.F. Xie, H.Y. Sun, C.S. Lee, and S.T. Lee, Contrast Improvement of Organic Light-Emitting Devices with Sm:Ag Cathode, Applied Physics Letters 88, 083507 (2006).*

Korean Patent Abstracts No. 10-2003-0079457A for Publication No. KR 10-0473283, 2 pages.

Korean Patent Abstracts No. 10-2004-0104172A for Publication No. KR 10-0527191, 2 pages.

Korean Patent Abstracs No. 10-2007-0043293A for Publication No. KR 10-0721428, 2 pages.

* cited by examiner

ORGANIC LIGHT EMITTING DIODE DISPLAY

CROSS-REFERENCE TO RELATED APPLICATION

This application claims priority to and the benefit of Korean Patent Application No. 10-2011-0076031, filed in the Korean Intellectual Property Office on Jul. 29, 2011, the entire content of which is incorporated herein by reference.

BACKGROUND

1. Field

An organic light emitting diode (OLED) display is provided.

2. Description of Related Art

Unlike a liquid crystal display (LCD), an organic light emitting diode (OLED) display has light emitting characteristics and does not require a separate light source. As such, the thickness and the weight of the organic light emitting diode (OLED) display may be reduced. Also, since the organic light emitting diode (OLED) display exhibits high definition characteristics such as low power consumption, high luminance and high reaction speed, and the like, it is spotlighted as a next-generation display device for a portable electronic device.

An organic light emitting diode (OLED) display includes a plurality of organic light emitting diodes having a hole injection electrode, an organic emission layer, and an electron injection electrode. In the organic emission layer, light emission is achieved by energy generated when exitons, produced by combination of electrons and holes, drop from the exited state to the ground state, and the organic light emitting diode (OLED) display forms an image therewith.

SUMMARY

An aspect of an embodiment of this disclosure is directed toward an organic light emitting diode display including an electrode having improved reliability and optical properties while having low resistance characteristics, and high efficiency characteristics.

An embodiment of this disclosure provides an organic light emitting diode display including: a first electrode; a second electrode facing the first electrode; and an emission layer interposed between the first electrode and the second electrode. Herein the first electrode includes: a first layer comprising a material having a work function of about 4.0 eV or less and an electron injection material; and a second layer comprising a material having a resistivity of about 10 μΩcm or less. The first layer is disposed between the second layer and the emission layer.

The first electrode may further include: a third layer comprising a material having a work function of about 4.0 eV or less and an electron injection material, and the second layer is disposed between the third layer and the first layer.

The material having the work function of about 4.0 eV or less may be at least one selected from the group consisting of ytterbium (Yb), samarium (Sm), lanthanum (La), yttrium (Y), calcium (Ca), strontium (Sr), cesium (Cs), ruthenium (Ru), and barium (Ba).

The electron injection material of the organic light emitting diode display may be an oxide, a fluoride, a quinolate, or an acetoacetate compound of an alkali metal or an alkaline-earth metal.

The electron injection material may be at least one selected from the group consisting of LiF, NaF, NaCl, CsF, $Li_2O$, BaO, lithium quinolate, and a combination thereof.

The first layer or the third layer may include the material having a work function of about 4.0 eV or less and the electron injection material in a weight ratio of about 100:1 to about 1:100.

The first layer or the third layer may have a thickness of about 5 to about 50 Å.

The material having the resistivity of about 10 μΩcm or less may be at least one selected from the group consisting of silver (Ag), aluminum (Al), copper (Cu), and chromium (Cr).

The second layer may further include a material having a work function of about 4.0 eV or less.

The second layer may include the material having the resistivity of about 10 μΩcm or less and the material having a work function of about 4.0 eV or less in a weight ratio of about 100:1 to about 1:100.

The second layer may have a thickness of about 30 to about 250 Å.

The first electrode may have a stacked structure where the first layer including LiF and Yb, the second layer including Ag, and the third layer including LiF and Yb are stacked, or a stacked structure where the first layer including LiF and Yb, the second layer including Ag and Yb, and the third layer including LiF and Yb are stacked.

The first electrode may have a light transmittance of about 20 to about 90% in a wavelength of about 550 nm.

The first electrode may have a sheet resistance of about 10 $\Omega/cm^2$ or less.

The first electrode may be a cathode, and the second electrode may be an anode.

The organic light emitting diode display according an embodiment has low resistance, low absorption optical properties, and excellent reliability.

DETAILED DESCRIPTION

This disclosure will be described more fully hereinafter with reference to the accompanying drawings, in which exemplary embodiments of this disclosure are shown. As those skilled in the art would realize, the described embodiments may be modified in various different ways, all without departing from the spirit or scope of this disclosure.

A part having no relationship with the description is omitted for clarity, and the same or similar constituent element is indicated by the same reference numeral throughout the specification.

The size and thickness of each constituent element as shown in the drawings are randomly indicated for better understanding and ease of description, and this disclosure is not necessarily limited as shown.

In the drawings, the thickness of layers, films, panels, regions, etc., are exaggerated for clarity. In the drawings, the thicknesses of some layers and regions are exaggerated for better understanding and ease of description. It will be understood that when an element such as a layer, film, region, or substrate is referred to as being "on" another element, it can be directly on the other element or one or more intervening elements may also be present. In contrast, when an element is referred to as being "directly on" another element, there are no intervening elements present.

Figure 1:
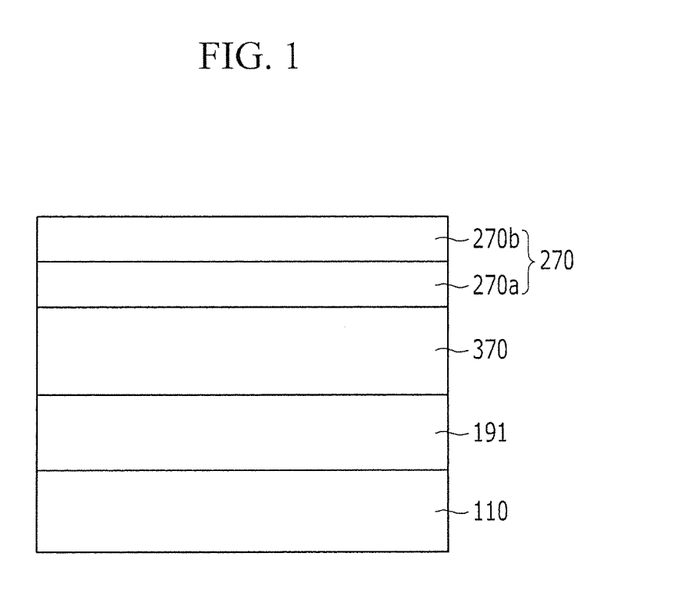
FIG. 1 is a cross-sectional view of an organic light emitting diode display according to one embodiment of this disclosure.

FIG. 1 is a cross-sectional view of an organic light emitting diode display according to one embodiment of this disclosure.

Referring to FIG. 1, the organic light emitting diode display includes a substrate 110, a second electrode 191 disposed on the substrate 110, a light emitting member 370 disposed on the second electrode 191, and a first electrode 270 disposed on the light emitting member 370.

The substrate 110 may be made of glass, a silicon wafer, a polymer film, or the like.

The second electrode 191 may be made of a transparent conductor or an opaque conductor. The transparent conductor may be, for example, a transparent conductive oxide. The opaque conductor may be, for example, a metal such as aluminum (Al), copper (Cu), molybdenum (Mo), silver (Ag), or a combination thereof.

The light emitting member 370 may have a multi-layer structure including an emission layer and an auxiliary layer to improve efficiency of the emission layer.

The emission layer may be made of an organic material emitting one light among primary colors such as red, green, blue, or the like, or a mixture of an inorganic material with the organic material, for example, a polyfluorene derivative, a (poly)paraphenylenevinylene derivative, a polyphenylene derivative, a polyfluorene derivative, polyvinylcarbazole, a polythiophene derivative, or a compound prepared by doping these polymer materials with a perylene-based pigment, a cumarine-based pigment, a rothermine-based pigment, rubrene, perylene, 9,10-diphenylanthracene, tetraphenylbutadiene, Nile red, coumarin, quinacridone, or the like. The organic light emitting diode device may display an image through a spatial sum of basic colors emitted from an emission layer.

The auxiliary layer may include an electron transport layer (ETL) for balancing between electrons and holes, a hole transport layer (HTL) for reinforcing injection of electrons and holes, an electron injection layer (EIL), a hole injection layer (HIL), or the like. It may include one or more layers selected therefrom.

The first electrode 270 may include a first layer 270a and a second layer 270b.

The first layer 270a includes a material having a work function of about 4.0 eV or less and an electron injection material. The first layer 270a may be formed through a method such as co-depositing a material having a work function of about 4.0 eV or less and an electron injection material. In one embodiment, when the first layer 270a includes both the material having the work function of about 4.0 eV or less and the electron injection material, electrons are smoothly injected into an electron transport layer in the inside of the light emitting member 370. Since the first layer 270a facilitates the injection of electrons, the light emitting member 370 may omit the electron injection layer (EIL).

The material having a work function of about 4.0 eV or less may be a material having a work function of about 2.0 to about 4.0 eV, which includes ytterbium (Yb), samarium (Sm), lanthanum (La), yttrium (Y), calcium (Ca), strontium (Sr), cesium (Cs), ruthenium (Ru), barium (Ba), or a combination thereof. Since these metals have a low work function, electrons are easily injected and they have high light transmission in a visible ray region.

The electron injection material is a material for forming an electron injection layer (EIL). It may be a known material, for example, an oxide, fluoride, quinolate, acetoacetate compound of an alkali metal or an alkaline-earth metal, or a combination thereof. According to one embodiment of this disclosure, the electron injection material may be LiF, NaF, NaCl, CsF, $Li_2O$, BaO, lithium quinolate, or a combination thereof.

The second layer 270b includes a material having a resistivity of about 10 μΩcm. Since the material has low resistance, the resistance of the first electrode 270 may be decreased. Since the organic light emitting diode display uses a material having low resistance in the second layer 270b, the problem of IR drop may be effectively relieved, and thus it may be applied not only to a small area such as a mobile device, but also a large display where the IR drop may be a problem. Non-limiting examples of the materials each having a resistivity of about 10 μΩcm include silver (Ag), aluminum (Al), copper (Cu), chromium (Cr), and combinations thereof. Since these materials have excellent reflection characteristics, they may improve the efficiency of the organic light emitting diode display.

The second layer 270b may be formed of an alloy of the material having a resistivity of about 10 μΩcm or less and a material having a work function of about 4.0 eV or less. The material having a work function of about 4.0 eV or less is already described while describing the first layer 270a. Since both of the material having a resistivity of about 10 μΩcm or less and the material having a work function of about 4.0 eV have a low refractive index (n) and a small absorption coefficient (k), they may manifest excellent reflection characteristics in a thin film.

The second layer 270b may include the material having a resistivity of about 10 μΩcm or less and the material having a work function of about 4.0 eV or less in a weight ratio of about 100:1 to about 1:100. When the material having a low resistivity is used too much, light absorption tends to be decreased, and when the material having a low work function is used too much, the electron injection may be facilitated. Within the above range, however, the electrical and optical characteristics may be desired or optimized.

The first electrode 270 is stacked in a direction that a first layer 270a is disposed between a second layer 270b and a light emitting member 370 including an emission layer is disposed.

The material having a work function of about 4.0 eV or less and the electron injection material are already described before while the first layer 270a is described. As described above, by including the first layer 270a, the electron injection into the electron transport layer (ETL) inside the light emitting member 370 may be facilitated.

Figure 2:
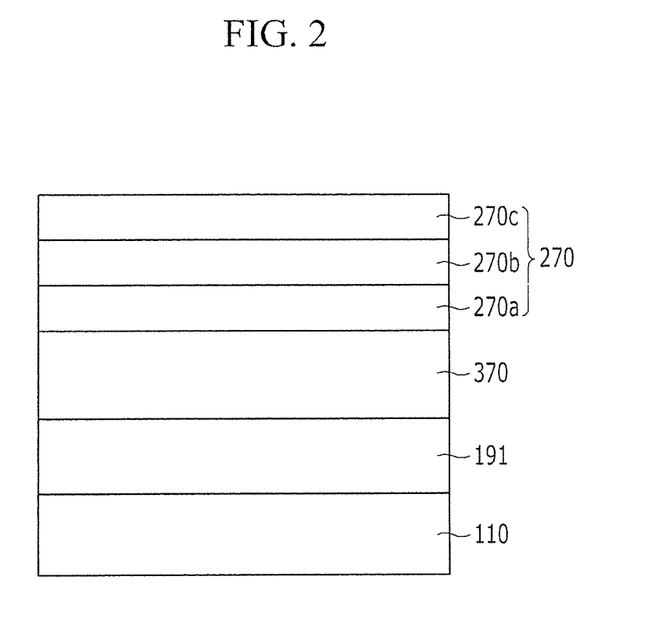
FIG. 2 is a cross-sectional view of an organic light emitting diode display according to another embodiment of this disclosure.

The first electrode 270 may further include a third layer 270c, which includes a material having a work function of about 4.0 eV or less and an electron injection material (refer to FIG. 2). For example, the first layer 270a, the second layer 270b, and the third layer 270c may be stacked in the mentioned order to form a cathode. The material having the work function of about 4.0 eV or less and the electron injection material are described above with the first layer 270a. By including the third layer 270c, the electrode material constituting the second layer 270b may be prevented or protected from being diffused.

In the first layer 270a and the third layer 270c, the material having a work function of about 4.0 eV or less and the electron injection material may be included in a weight ratio of about 1:100 to about 1:100. In one embodiment, within the above range, the second layer 270b (e.g., the upper layer) may have stabilized characteristics. For example, when the second layer 270b is an Ag thin film, the density of a thin film may be different according to the characteristics of the lower layer, and thus if the density of the Ag thin film becomes low, the optical absorption may be greatly increased.

According to one embodiment, the first electrode 270 may be formed of (or formed by stacking) the first layer 270a including LiF and Yb/the second layer 270b including Ag/the third layer 270c including LiF and Yb. According to another embodiment, the first electrode 270 may be formed of (or formed by stacking) the first layer 270a including LiF and Yb/the second layer 270b including Ag and Yb/the third layer 270c including LiF and Yb.

In an organic light emitting diode display, when the first layer 270a and the third layer 270c are not provided, the material having a resistivity of about 10 μΩcm or less of the second layer 270b may be diffused into the adjacent areas as operation repeats so as to form a diffusion barrier. The first layer 270a and/or the third layer 270c effectively prevent the diffusion of the material having a resistivity of about 10 μΩcm or less of the second layer 270b so as to prevent the generation of the diffusion barrier, and as a result, the thickness of the diffusion barrier may be reduced remarkably. Also, they may prevent the permeation of the light emitting member 370 into an organic layer, thus securing reliability.

The first layer 270a and the third layer 270c may have a thickness of about 5 Å to about 50 Å, and the second layer 270b may have a thickness of about 30 Å to about 250 Å. In one embodiment, since the first layer 270a, the second layer 270b, and the third layer 270c have a thickness of the range, they are appropriate to be applied to an organic light emitting diode display having low absorption optical properties and low resistance characteristics.

The first electrode 270 of the above thickness range may have low absorption optical properties. According to one embodiment, it may have both a light transmittance of about 20 to about 90% and a sheet resistance lower than about 30 Ω/cm² in a wavelength of about 550 nm.

In the organic light emitting diode display, the first electrode may be a cathode, and the second electrode may be an anode. The organic light emitting diode display may realize low absorption optical properties and low resistance characteristics, and the organic light emitting diode display may be diversely applied to top light emission, bottom emission, both-side light emission, and this disclosure is not limited to a particular embodiment.

The following examples illustrate this disclosure in more detail. These examples, however, are not in any sense to be interpreted as limiting the scope of this disclosure.

Fabrication of an Organic Light Emitting Diode Display

EXAMPLE 1

A cathode was fabricated by stacking an ITO, which was an anode, on a glass substrate, performing a patterning process, depositing an NPB (N,N-dinaphthalen-1-yl-N,N-diphenyl benzidine) thereon as a hole injection layer (HIL) and hole transport layer (HTL), doping 1 wt % of coumarin 6 on Alq3 (tris 8-hydroquinoline aluminum) and performing a codeposition so as to form an electron transport layer (ETL), depositing Alq3 (tris 8-hydroquinoline aluminum) as an electron transport layer (ETL) again thereon, codepositing ytterbium (Yb) and LIE (at a volume ratio of 1:1) thereon in a thickness of 20 Å, and depositing silver (Ag) to a thickness of 185 Å.

EXAMPLE 2

An organic light emitting diode display was manufactured according to the same method as Example 1, except that a cathode was fabricated by codepositing ytterbium (Yb) and LiF (at a volume ratio of 1:1) in a thickness of 20 Å, and depositing silver (Åg) and ytterbium (Yb) (at a volume ratio of 10:1) to a thickness of 160 Å.

COMPARATIVE EXAMPLE 1

ITO, which is an anode, was deposited on a glass substrate and a patterning process was performed. Subsequently, NPB was deposited as a hole injection layer (HIL) and hole transport layer (HTL), and then codeposition was performed to form an emission layer by doping 1 wt % of coumarin 6 on Alq3. Subsequently, Alq3 was deposited again as an electron transport layer (ETL). Subsequently, magnesium (Mg) and silver (Ag) were deposited to a thickness of 100 Å.

Evaluation 1

The sheet resistance characteristics of the organic light emitting diode displays manufactured according to Examples 1 and 2 and Comparative Example 1 were presented in the following Table 1. The sheet resistance characteristics were measured through a 4-point probe method.

TABLE 1

| | Sheet resistance (Ω/cm²) |
|---|---|
| Example 1 | 5 |
| Example 2 | 10 |
| Comparative Example 1 | 50 |

Evaluation 2

Figure 3A:
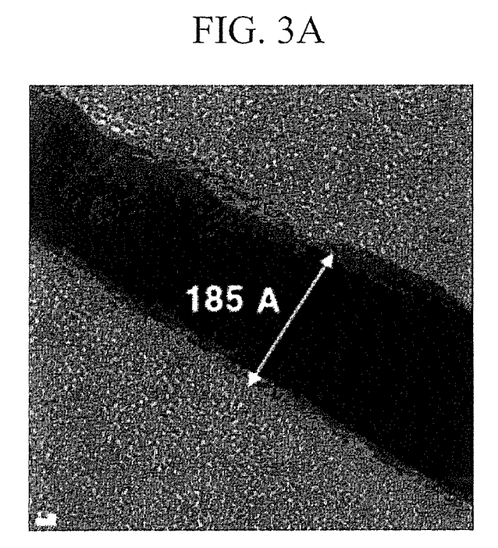
FIG. 3A is a TEM photograph of an organic light emitting diode display according to an Example of this disclosure after the deposition of a cathode.
Figure 3B:
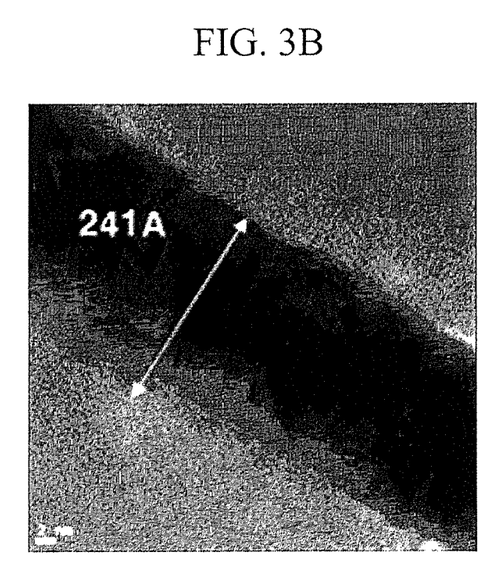
FIG. 3B is a TEM photograph of an organic light emitting diode display according to an Example of this disclosure after operation at a high temperature.
Figure 4A:
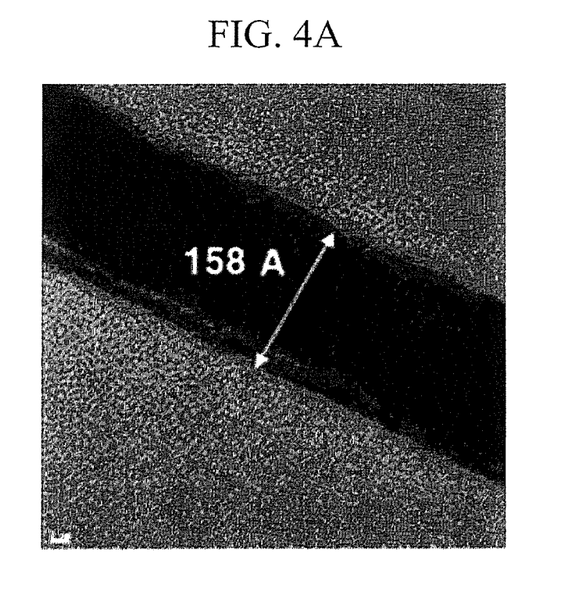
FIG. 4A is a TEM photograph an organic light emitting diode display according to another Example of this disclosure after deposition of a cathode.
Figure 4B:
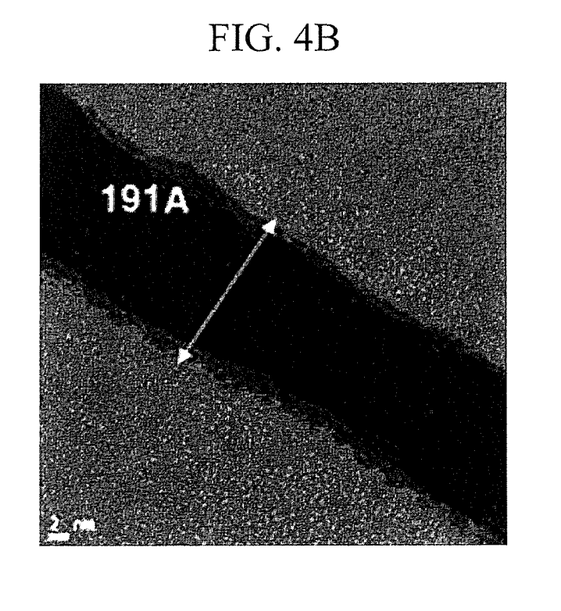
FIG. 4B is a TEM photograph of an organic light emitting diode display according to another Example of this disclosure after operation at a high temperature.
Figure 5A:
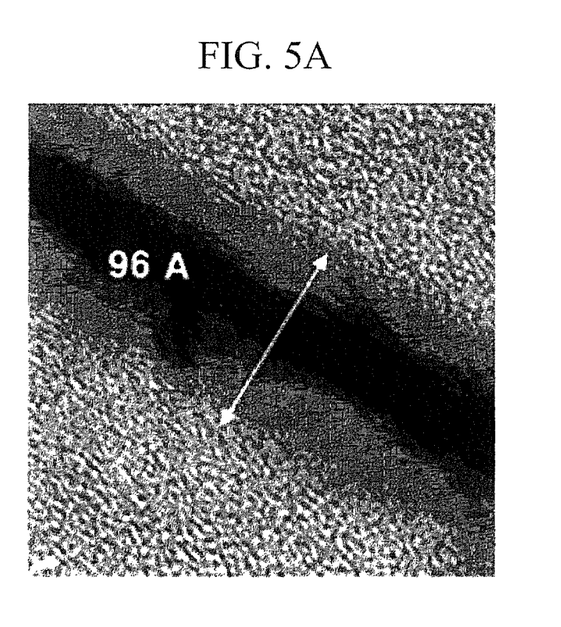
FIG. 5A is a TEM photograph of an organic light emitting diode display according to a Comparison Example of this disclosure after deposition of a cathode.
Figure 5B:
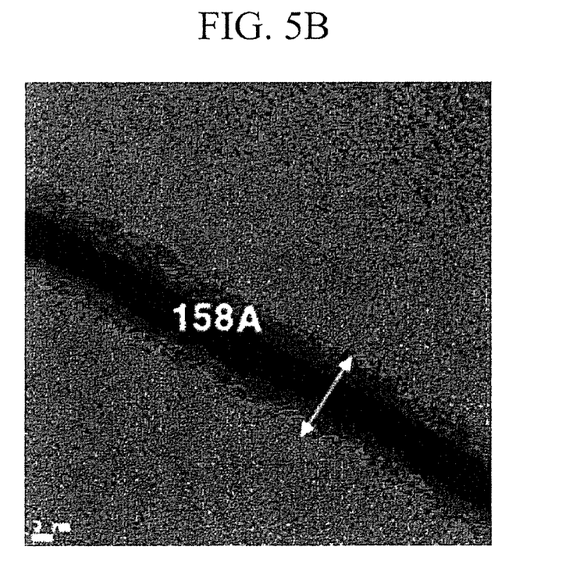
FIG. 5B is a TEM photograph of an organic light emitting diode display according to a Comparative Example of this disclosure after operation at a high temperature.

TEM photographs of the cathodes of the organic light emitting diode displays manufactured according to Examples 1 and 2 and Comparative Example 1 were taken, and then the cathodes were kept at 70° C. to estimate their reliabilities at a high temperature and their TEM photographs were taken again for comparison. FIGS. 3A, 4A and 5A are TEM photographs of the organic light emitting diode displays according to Examples 1 and 2 and Comparative Example 1 after their first electrodes are deposited. FIGS. 3B, 4B, and 5B are TEM photographs of the organic light emitting diode displays according to Examples 1 and 2 and Comparative Example 1 after the organic light emitting diode displays are kept at a high temperature. The TEM photograph results were presented in the following Table 2.

Also, the color coordinates of the organic light emitting diode displays manufactured according to Examples 1 and 2 and Comparative Example 1 were measured and the results were presented in the following Table 2.

TABLE 2

|  | Cathode | Cathode thickness A (including diffusion barrier) | Color coordinate/ Relative efficiency | |
|---|---|---|---|---|
| Example 1 (immediately after deposition) | Ag | 185 | (0.132, 0.063) 1.031 | Ag monolayer |
| Example 1 (after operation at high temperature) |  | 241 | (0.131, 0.063) 0.922 | Ag monolayer + Ag diffusion barrier |
| Example 2 (immediately after deposition) | AgYb 10:1 | 158 | (0.133, 0.063) 1.050 | AgYb monolayer |
| Example 2 (after operation at high temperature) |  | 191 | (0.133, 0.063) 1.011 | AgYb monolayer + AgYb diffusion barrier |
| Comparative Example 1 (immediately after deposition) | MgAg | 96 | (0.137, 0.054) 1.000 | MgAg monolayer |
| Comparative Example 1 (after operation at high temperature) |  | 158 | (0.136, 0.054) 0.887 | MgAg monolayer + MgAg diffusion barrier |

While this disclosure has been described in connection with what is presently considered to be practical exemplary embodiments, it is to be understood that this disclosure is not limited to the disclosed embodiments, but on the contrary, is intended to cover various modifications and equivalent arrangements included within the spirit and scope of the appended claims.

| Description of symbols | |
|---|---|
| 110: substrate | 191: second electrode |
| 270: first electrode | 270a: first layer |
| 270b: second layer | 270c: third layer |
| 370: organic light emitting member | |

What is claimed is:

1. An organic light emitting diode display, comprising:
   a first electrode;
   a second electrode facing the first electrode; and
   an emission layer between the first electrode and the second electrode, wherein the first electrode comprises:
   a first layer comprising a material having a work function of about 4.0 eV or less and an electron injection material; and
   a second layer comprising a material having a resistivity of about 10 μΩcm or less, and the first layer is disposed between the second layer and the emission layer, wherein the electron injection material in the first layer is an oxide, a fluoride, a quinolate, or an acetoacetate compound of an alkali metal or an alkaline-earth metal, wherein the first layer comprises the material having the work function of about 4.0 eV or less mixed with the electron injection material in a weight ratio of about 100:1 to about 1:100.

2. The organic light emitting diode display of claim 1, wherein the first electrode further comprises:
   a third layer comprising a material having a work function of about 4.0 eV or less and an electron injection material, and the second layer is disposed between the third layer and the first layer.

3. The organic light emitting diode display of claim 1, wherein the material having the work function of about 4.0 eV or less in the first layer is at least one selected from the group consisting of ytterbium (Yb), samarium (Sm), lanthanum (La), yttrium (Y), calcium (Ca), strontium (Sr), cesium (Cs), ruthenium (Ru), and barium (Ba).

4. The organic light emitting diode display of claim 2, wherein the material having the work function of about 4.0 eV or less in the third layer is at least one selected from the group consisting of ytterbium (Yb), samarium (Sm), lanthanum (La), yttrium (Y), calcium (Ca), strontium (Sr), cesium (Cs), ruthenium (Ru), and barium (Ba).

5. The organic light emitting diode display of claim 2, wherein the electron injection material in the third layer is an oxide, a fluoride, a quinolate, or an acetoacetate compound of an alkali metal or an alkaline-earth metal.

6. The organic light emitting diode display of claim 1, wherein the electron injection material in the first layer is at least one selected from the group consisting of LiF, NaF, NaCl, CsF, Li$_2$O, BaO, lithium quinolate, and a combination thereof.

7. The organic light emitting diode display of claim 2, wherein the third layer comprises the material having the work function of about 4.0 eV or less and the electron injection material in a weight ratio of about 100:1 to about 1:100.

8. The organic light emitting diode display of claim 1, wherein the first layer has a thickness of about 5 to about 50Å.

9. The organic light emitting diode display of claim 2, wherein the first layer or the third layer has a thickness of about 5 to about 50Å.

10. The organic light emitting diode display of claim 1, wherein the material having the resistivity of about 10 μΩcm or less is at least one selected from the group consisting of silver (Ag), aluminum (Al), copper (Cu), and chromium (Cr).

11. The organic light emitting diode display of claim 1, wherein the second layer further comprises a material having a work function of about 4.0 eV or less.

12. The organic light emitting diode display of claim 11, wherein the second layer comprises the material having the resistivity of about 10 μΩcm or less and the material having the work function of about 4.0 eV or less in a weight ratio of about 100:1 to about 1:100.

13. The organic light emitting diode display of claim 1, wherein the second layer has a thickness of about 30 to about 250Å.

14. An organic light emitting diode display, comprising:
a first electrode;
a second electrode facing the first electrode; and
an emission layer between the first electrode and the second electrode,
wherein the first electrode comprises:
a first layer comprising a material having a work function of about 4.0 eV or less and an electron injection material; and
a second layer comprising a material having a resistivity of about 10 μΩcm or less, and
the first layer is disposed between the second layer and the emission layer,
wherein the first electrode has a stacked structure where the first layer including LiF and Yb, the second layer including Ag, and a third layer including LiF and Yb are stacked.

15. An organic light emitting diode display, comprising:
a first electrode;
a second electrode facing the first electrode; and
an emission layer between the first electrode and the second electrode,
wherein the first electrode comprises:
a first layer comprising a material having a work function of about 4.0 eV or less and an electron injection material; and
a second layer comprising a material having a resistivity of about 10 μΩcm or less, and
the first layer is disposed between the second layer and the emission layer,
where the first electrode has a stacked structure wherein the first layer including LiF and Yb, the second layer including Ag and Yb, and a third layer including LiF and Yb are stacked.

16. The organic light emitting diode display of claim 1, wherein the first electrode has a light transmittance of about 20 to about 90% in a wavelength of about 550 nm.

17. The organic light emitting diode display of claim 1, wherein the first electrode has a sheet resistance of about 30 Ω/cm² or less.

18. The organic light emitting diode display of claim 1, wherein the first electrode is a cathode, and the second electrode is an anode.

19. An organic light emitting diode display, comprising:
a first electrode;
a second electrode facing the first electrode; and
an emission layer between the first electrode and the second electrode,
wherein the first electrode comprises:
a first layer comprising a material having a work function of about 4.0 eV or less mixed with an electron injection material; and
a second layer comprising a material having a resistivity of about 10 μΩcm or less, and
the first layer is disposed between the second layer and the emission layer,
wherein the second layer further comprises another material having a work function of about 4.0 eV or less and differing from the material having the resistivity of about 10 μΩcm or less.

* * * * *